US009938620B2

(12) United States Patent
Moroi et al.

(10) Patent No.: US 9,938,620 B2
(45) Date of Patent: Apr. 10, 2018

(54) GAS SUPPLY MECHANISM, GAS SUPPLYING METHOD, FILM FORMING APPARATUS AND FILM FORMING METHOD USING THE SAME

(71) Applicant: TOKYO ELECTRON LIMITED, Tokyo (JP)

(72) Inventors: Masayuki Moroi, Nirasaki (JP); Hajime Yamanaka, Nirasaki (JP); Yasushi Aiba, Nirasaki (JP); Takanobu Hotta, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/669,795

(22) Filed: Mar. 26, 2015

(65) Prior Publication Data

US 2015/0275367 A1 Oct. 1, 2015

(30) Foreign Application Priority Data

Mar. 28, 2014 (JP) .................................. 2014069964

(51) Int. Cl.
*C23C 16/455* (2006.01)
*C23C 16/448* (2006.01)
*C23C 16/52* (2006.01)
*C23C 16/08* (2006.01)

(52) U.S. Cl.
CPC ........ *C23C 16/45557* (2013.01); *C23C 16/08* (2013.01); *C23C 16/4481* (2013.01); *C23C 16/45544* (2013.01); *C23C 16/52* (2013.01)

(58) Field of Classification Search
None
See application file for complete search history.

(56) References Cited

U.S. PATENT DOCUMENTS 5,491,005 A * 2/1996 Hoshino .................. C07F 1/00
117/103
2002/0170484 A1* 11/2002 Katamine .......... C23C 16/4411
117/4

(Continued)

FOREIGN PATENT DOCUMENTS

JP        4-359516 A       12/1992
JP       2006-52424 A       2/2006

(Continued)

OTHER PUBLICATIONS

Ichiro, JP2013-30569, Feb. 2013, English translation.*

*Primary Examiner* — Joseph A Miller, Jr.
(74) *Attorney, Agent, or Firm* — Nath, Goldberg & Meyer; Jerald L. Meyer

(57) ABSTRACT

A gas supply mechanism of supplying a raw material gas obtained from a raw material of a solid state or a liquid state into a chamber configured to perform a film forming process on a workpiece is disclosed. The gas supply mechanism includes a gas supply controller configured to control a flow rate of a carrier gas by means of a flow rate controller, and to enable the carrier gas to flow while closing a material gas supply/shut-off valve to thereby increase internal pressures of a raw material container and a raw material gas supply pipe to be a high-pressure condition and then control the raw material gas supply/shut-off valve to be opened.

9 Claims, 5 Drawing Sheets

(56) References Cited

U.S. PATENT DOCUMENTS

| | | | |
|---|---|---|---|
| 2003/0022779 A1* | 1/2003 | Ohtsubo | B31B 19/00 493/394 |
| 2006/0032444 A1* | 2/2006 | Hara | C23C 16/4481 118/715 |
| 2009/0325389 A1* | 12/2009 | Takebayashi | C23C 16/4408 438/758 |

FOREIGN PATENT DOCUMENTS

| | | |
|---|---|---|
| JP | 2013019003 A | 1/2013 |
| JP | 2013-30569 A | 2/2013 |
| WO | 2009/113400 A1 | 9/2009 |

* cited by examiner

GAS SUPPLY MECHANISM, GAS
SUPPLYING METHOD, FILM FORMING
APPARATUS AND FILM FORMING
METHOD USING THE SAME

CROSS-REFERENCE TO RELATED
APPLICATION

This application claims the benefit of Japanese Patent Application No. 2014-069964, filed on Mar. 28, 2014, in the Japan Patent Office, the disclosure of which is incorporated herein in its entirety by reference.

TECHNICAL FIELD

The present disclosure relates to a gas supply mechanism and a gas supplying method for use in applications for intermittently supplying a raw material gas into a chamber, such as an ALD (Atomic Layer Deposition) method and the like, a film forming apparatus and a film forming method using the same.

BACKGROUND

In recent years, as semiconductor devices have been miniaturized, an ALD method has received attention in a film forming process due to its low film forming temperature and good step coverage.

When the ALD method is used to form a film, a plurality of raw material gases is alternately supplied into a chamber which accommodates a semiconductor wafer (hereinafter referred to as a "wafer") as a workpiece. For this gas supply, in a case where a liquid raw material or a solid raw material whose vapor pressure is low is used as a film forming raw material, a method of bubbling the raw material accommodated in a container with a carrier gas for supply into the chamber has been known. In addition, a method of vaporizing a liquid raw material with a vaporizer for supply into the chamber by a carrier gas has been known. In this method, while vaporizing the liquid raw material in a container and regulating a supply pressure of the raw material gas to a desired pressure by means of an automatic pressure regulator, the raw material gas is supplied into the chamber at a preset flow rate, so that a desired flow rate of the raw material gas can be supplied without using the carrier gas.

However, in the case of the ALD method, it is necessary to switch on/off a raw material gas in a short time and supply the raw material gas at a high flow rate. However, the supply of liquid raw material or solid raw material having a low vapor pressure according to the above-described method has the following problems.

That is, in the method of bubbling the raw material with the carrier gas to supply the raw material gas, conventionally, the raw material gas sent from a container for bubbling is switched on/off by an opening/closing valve, which is hard to supply the raw material gas at a high flow rate while switching on/off for a short time. In addition, in a case where the supply pressure of raw material gas is controlled by an automatic pressure controller without using a carrier gas, it is also hard to supply the raw material gas at a high flow rate while switching on/off for a short time. In addition, in a case of the method of supplying a raw material gas, which is obtained by vaporizing a raw material by means of a vaporizer, with a carrier gas, since the raw material cannot be vaporized if a secondary pressure at the rear side of the vaporizer is high, an opening/closing valve installed in a gas supply pipe guiding the raw material gas into a chamber and an opening/closing valve installed in a bypass pipe bypassed from the vaporizer to an exhaust line are alternately switched on/off to switch on/off the raw material gas. In such case, since pressure variation in the interior of the vaporizer is accompanied, a pressure cannot be raised up to the maximum vaporization partial pressure, which naturally causes a limit in the supply amount of gas. In addition, during a period of time that the raw material is not supplied into the chamber, the raw material gas is discarded, wasting a raw material.

SUMMARY

Some embodiments of the present disclosure provide a gas supply mechanism and a gas supplying method which are capable of supplying a raw material gas, which is generated from a liquid raw material or a solid raw material, into a chamber at a high flow rate in a short time, and preventing a raw material from being wasted, and a film forming apparatus and a film forming method using the same.

According to one embodiment of the present disclosure, there is provided a gas supply mechanism of supplying a raw material gas obtained from a raw material of a solid state or a liquid state into a chamber configured to perform a film forming process on a workpiece. The gas supply mechanism includes: a raw material container configured to accommodate a raw material in a solid state or a liquid state; a heater configured to heat the raw material for sublimation or vaporization in the raw material container; a carrier gas supply pipe configured to supply a carrier gas into the raw material container; a flow rate controller configured to control a flow rate of the carrier gas in the carrier gas supply pipe; a raw material gas supply pipe configured to supply a raw material gas generated by the sublimation or vaporization of the raw material in the raw material container into the chamber along with the carrier gas; a raw material gas supply/shut-off valve installed on the raw material gas supply pipe in the vicinity of the chamber and configured to be opened/closed to supply/shut off the raw material gas into the chamber in a film forming process; and a gas supply controller configured to control a flow rate of the carrier gas by means of the flow rate controller, and to enable the carrier gas to flow while closing the material gas supply/shut-off valve to thereby increase internal pressures of the raw material container and the raw material gas supply pipe to be a high-pressure condition and then control the raw material gas supply/shut-off valve to be opened.

According to another embodiment of the present disclosure, there is provided a gas supply method for accommodating a raw material of a solid state or a liquid state in a raw material container, heating the raw material in the raw material container for sublimation or vaporization, supplying a carrier gas into the raw material container through a carrier gas supply pipe, and supplying a raw material gas generated by the sublimation or vaporization of the raw material in the raw material container, along with the carrier gas, through a raw material gas supply pipe, into a chamber configured to perform a film forming process on a workpiece. The method includes: installing a raw material gas supply/shut-off valve on the raw material gas supply pipe in the vicinity of the chamber, the raw material gas supply/shut-off valve being opened/closed to supply/shut off of the raw material gas into the chamber in a film forming process; and controlling a flow rate the carrier gas and enabling the carrier gas to flow while closing the material gas supply/shut-off valve to thereby increase internal pressures of the raw material container and the raw material gas supply pipe to be a high-pressure condition, and then controlling the raw material gas supply/shut-off valve to be opened.

According to a further embodiment of the present disclosure, a film forming apparatus for forming a predetermined film on a workpiece using an atomic layer deposition method of alternately supplying and reacting a first gas, which is a raw material gas generated from a raw material of a solid state or a liquid state, and a second gas, which is a reducing gas, for reaction, includes: a chamber configured to accommodate a workpiece; a first gas supply mechanism configured to supply the first gas as a raw material gas into the chamber; a second gas supply mechanism configured to supply the second gas as a reducing gas into the chamber; an exhaust mechanism configured to exhaust the chamber; and a control unit configured to control the first gas supply mechanism and the second gas supply mechanism to alternately supply the first gas and the second gas. The first gas supply mechanism includes: a raw material container configured to accommodate a raw material of a solid state or a liquid state; a heater configured to heat the raw material for sublimation or vaporization in the raw material container; a carrier gas supply pipe configured to supply a carrier gas into the raw material container; a flow rate controller configured to control a flow rate of the carrier gas in the carrier gas supply pipe; a raw material gas supply pipe configured to supply the first gas as a raw material gas generated by the sublimation or vaporization of the raw material in the raw material container into the chamber along with the carrier gas; a raw material gas supply/shut-off valve installed on the raw material gas supply pipe in the vicinity of the chamber and configured to be opened/closed to supply/shut off the first gas as the raw material gas into the chamber in a film forming process; and a gas supply controller configured to control a flow rate of the carrier gas by means of the flow rate controller, and to enable the carrier gas to flow while closing the material gas supply/shut-off valve to thereby increase internal pressures of the raw material container and the raw material gas supply pipe to be a high-pressure condition, and then control the raw material gas supply/shut-off valve to be opened.

According to another embodiment of the present disclosure, there is provided a film forming method for forming a predetermined film on a workpiece using an atomic layer deposition method by alternately performing a process of supplying a first gas, which is a raw material gas generated from a raw material of a solid state or a liquid state, into a chamber accommodating a workpiece, and a process of supplying a second gas, which is a reducing gas, into the chamber. The process of supplying the first gas is performed by accommodating the raw material of a solid state or a liquid state in a raw material container, heating the raw material in the raw material container for sublimation or vaporization, supplying a carrier gas into the raw material container through a carrier gas supply pipe, and supplying the first gas as a raw material gas generated by the sublimation or vaporization of the raw material in the raw material container, along with the carrier gas, through a raw material gas supply pipe, into the chamber. The process of supplying the first gas includes: installing a raw material gas supply/shut-off valve on the raw material gas supply pipe in the vicinity of the chamber, the raw material gas supply/shut-off valve being opened/closed to supply/shut off the raw material gas into the chamber in a film forming process; and controlling a flow rate of the carrier gas and enabling the carrier gas to flow while closing the material gas supply/shut-off valve to thereby increase internal pressures of the raw material container and the raw material gas supply pipe to be a high-pressure condition, and then controlling the raw material gas supply/shut-off valve to be opened.

According to another embodiment of the present disclosure, there is provided a non-transitory storage medium storing a program that, when executed on a computer, causes the computer to control a film forming apparatus to perform the aforementioned film forming method.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Gas Supply Mechanism>

Figure 1:
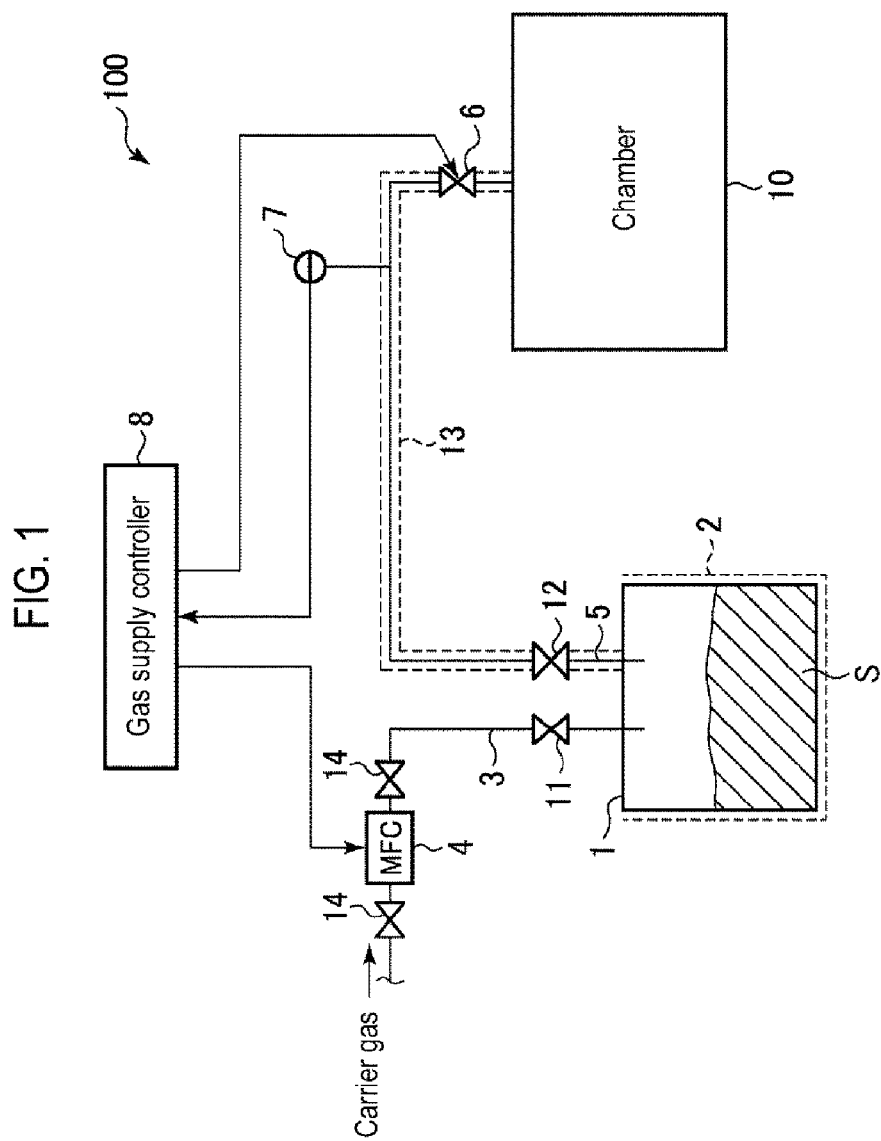
FIG. 1 is a schematic view showing a gas supply mechanism according to one embodiment of the present disclosure.

FIG. 1 is a schematic view showing a gas supply mechanism according to one embodiment of the present disclosure. The gas supply mechanism according to one embodiment of the present disclosure is adapted to an ALD film forming process of intermittently supplying a film forming raw material, which is in a solid or liquid state with a low vapor pressure, as a raw material gas, into a chamber of a film forming apparatus by a carrier gas.

As shown in FIG. 1, the gas supply mechanism 100 includes a raw material container 1 configured to accommodate a raw material S in a solid state or a liquid state, a heater 2 configured to heat the raw material container 1 to sublimate or vaporize the raw material, a carrier gas supply pipe 3 configured to supply a carrier gas into the raw material container 3 from an upper part thereof, a mass flow controller 4 as a flow rate controller installed on the carrier gas supply pipe 3, a raw material gas supply pipe 5 configured to supply a raw material gas generated in the raw material container 1 into a chamber 10 along with the carrier gas, a raw material gas supply and shut-off valve 6 installed on the raw material gas supply pipe 5 in the vicinity of the chamber 10 and configured to open and close to supply and shut off the raw material gas into the chamber 10 during a film forming process, a pressure gauge 7 configured to detect a gas pressure in the raw material gas supply pipe 5, and a gas supply controller 8 configured to control the mass flow controller 4 and the raw material gas supply/shut-off valve 6.

An opening/closing valve 11 is installed on the carrier gas supply pipe 3 in the vicinity of the raw material container 1, and an opening/closing valve 12 is installed on the raw material gas supply pipe 5 in the vicinity of the raw material container 1. These valves become an opened state while the film forming process is being performed. In addition, a heater 13 is provided around the raw material gas supply pipe 5 to prevent the raw material gas from being condensed.

In addition, opening/closing valves 14 are installed on the carrier gas supply pipe 3 in the front and rear of the mass flow controller 4, respectively. In addition, the gas supply controller 8 controls opening/closing of valves (the valves 11, 12 and 14 and so on) in addition to the raw material gas supply/shut-off valve 6.

In the gas supply mechanism 100 as configured above, when the raw material gas is supplied, the opening/closing valves 11 and 12 and the raw material gas supply/shut-off valve 6 are closed and the raw material S within the raw material container 1 is heated to a certain temperature (for example, 80 to 300 degrees C.) by the heater 2 to be sublimated or vaporized. Next, the valve 14 is opened based on a command from the gas supply controller 8 along with opening of the opening/closing valves 11 and 12, so that the carrier gas flows into the raw material container 1 at a specific flow rate via the carrier gas supply pipe 3 by controlling the flow rate with the mass flow controller 4 to be bubbled, thereby sublimating or vaporizing the raw material in the raw material container 1 to generate a raw material gas. Then, the raw material gas is supplied, along with the carrier gas, into the raw material gas supply pipe 5, so that the raw material container 1 and the raw material gas supply pipe 5 become a high-pressure condition. Under this condition, the raw material gas supply/shut-off valve 6 is opened to perform an operation of supplying the raw material gas into the chamber 10. This operation and an operation of shutting off the supply of the raw material by closing the raw material gas supply/shut-off valve 6 are performed at a certain cycle to intermittently supply the raw material gas into the chamber 10. As a particular control at this time, for example, the gas supply controller 8 controls: the flow rate of the carrier gas at a predetermined flow rate; the raw material gas supply/shut-off valve 6 to be opened to supply the raw material gas into the chamber 10 after a predetermined time, corresponding to the predetermined flow rate, elapses; and the raw material gas supplying operation and the raw material gas stopping operation to be performed at a certain cycle, as described above. In such a case, the supply cycle of the raw material gas is, for example, about 0.01 to 10 sec. A pressure of the raw material gas supply pipe 5 can be detected by the pressure gauge 7. Then, the gas supply controller 8 may monitor the pressure of the raw material gas supply pipe 5 through the pressure gauge 7 and close the opening/closing valve 11 to stop the supply of the carrier gas when a detected value by the pressure gauge 7 exceeds a preset value. In addition, the gas supply controller 8 may set a predetermined set value in a pressure of the raw material gas supply pipe 5, obtain a difference between a detected value of the pressure gauge 7 and the predetermined value, and issue a control command to the mass flow controller 4 to control the flow rate of the carrier gas to eliminate the difference. In such a case, the control may be proportional-integral-derivative (PID) control in view of performing high precision control. In addition, the pressure gauge may be installed in the raw material container 1 to detect the internal pressure of the raw material container 1.

Thus, since interiors of the raw material container 1 and the raw material gas supply pipe 5 become the high-pressure condition when the raw material gas supply/shut-off valve 6 is closed, the raw material gas can be introduced into the chamber 10 at high pressure by opening the raw material gas supply/shut-off valve 6. In addition, although the internal pressures of the raw material container 1 and the raw material gas supply pipe 5 are lowered by opening the raw material gas supply/shut-off valve 6 in supplying the raw material gas, the internal pressures are raised again in a short time when the raw material gas supply/shut-off valve 6 is closed. Accordingly, even for intermittent supply of the raw material gas, a high flow rate of raw material gas can be introduced into the chamber 10 at a high pressure at a time of opening the raw material gas supply/shut-off valve 6. In such a case, when the raw material gas supply/shut-off valve 6 is opened and closed, the mass flow controller 4 may be controlled to be predetermined pressures, respectively.

In this case, the pressure of the raw material gas is optional and can be increased up to the maximum vapor pressure, i.e., the saturated vapor pressure, for the heating temperature of the raw material, which can maximize the flow rate of raw material gas. In addition, as in a case of supplying the raw material gas vaporized using a vaporizer, it is not needed to waste the raw material gas when the raw material gas is not supplied into the chamber, which results in that the raw material is not wasted.

The gas supply mechanism for supplying a solid raw material or a liquid raw material in a bubbling manner as in this embodiment has existed conventionally. However, conventionally, the raw material container is merely used as a simple bubbler and silent as to the concept of increasing the pressures of the raw material container and the raw material gas supply pipe to supply the raw material gas into the chamber. In addition, conventionally, intermittent supply of the raw material gas is basically performed according to switching-ON/OFF of the raw material gas sent from the raw material container in forming a film using an ALD method. However, in this case, in order to supply the raw material gas into the chamber at a high flow rate, it is needed to set a heating temperature of the raw material to a high temperature or set a pressure of the raw material to a low pressure. However, there is naturally an upper limit on the heating temperature in view of retaining a chemical structure of the raw material and conserving the apparatus. In addition, it is hard to provide the raw material gas at a high flow rate in supplying a gas in a short time such as the intermittent supply of raw material gas at a low-pressure condition. On the contrary, the embodiment of the present disclosure provides a technical feature of supplying the raw material gas by continuously flowing a carrier gas at a predetermined flow rate into the raw material container 1 to thereby maintain the internal pressures of the raw material container 1 and the raw material gas supply pipe 5 at a high pressure, and opening/closing the raw material gas supply/shut-off valve 6 installed on the raw material gas supply pipe 5 in the vicinity of the chamber 10, which is different entirely from the above-described prior art, so that the raw material gas can be supplied into the chamber 10 at a high flow rate in a short time even in the case of intermittently supplying the raw material gas.

Figure 2:
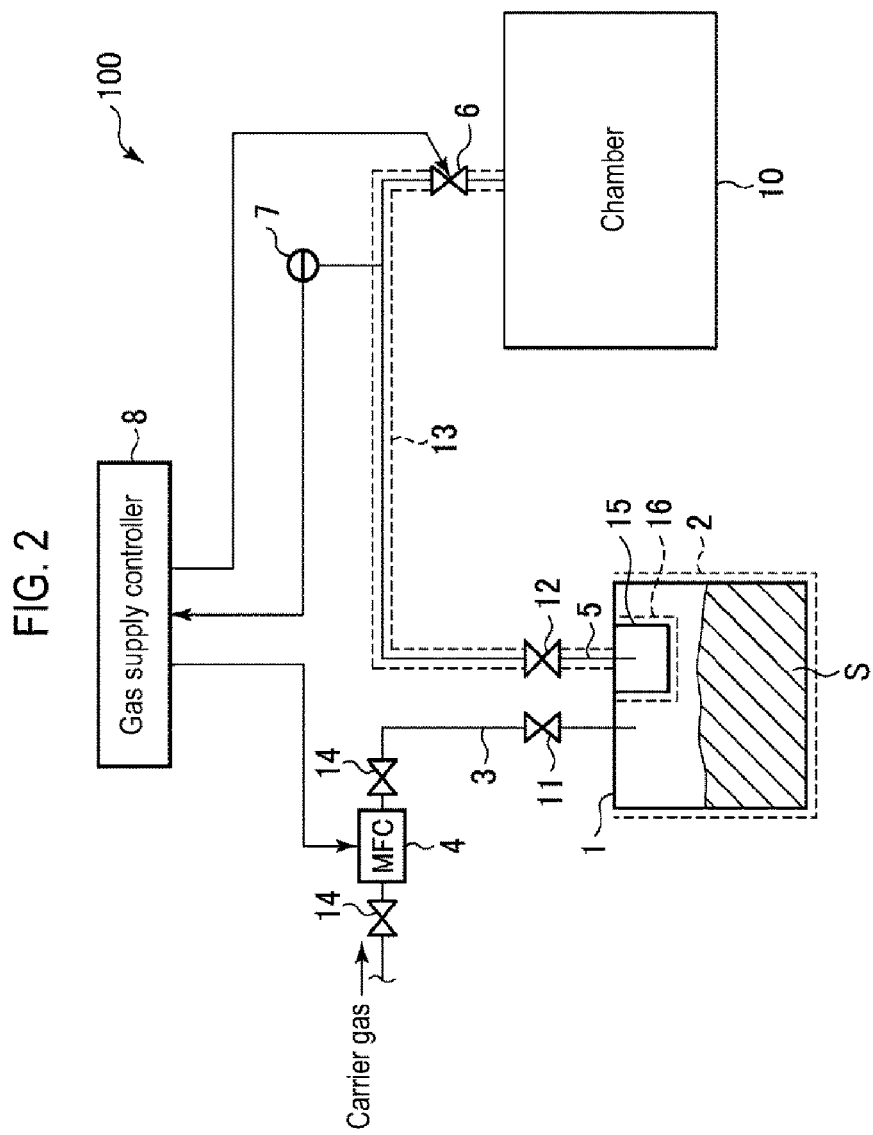
FIG. 2 is a schematic view showing another example of a gas supply mechanism.

Next, another example of the gas supply mechanism will be described. FIG. 2 is a schematic view showing another example of the gas supply mechanism. In this example, the raw material container 1 includes a trap mechanism (filter)

15 covering an end portion of the raw material gas supply pipe 5 which is inserted from an upper part of the raw material container 1. In addition, a heater 16 is installed on the trap mechanism 15.

As installing the trap mechanism 15, if the raw material S is in a form of powder, the powder itself flown up by the carrier gas can be trapped, and if the raw material S is in a form of liquid, scattered mists can be trapped. In addition, the powder or mists adhered to the trap mechanism 15 can be sublimated or vaporized by the heater 16, thereby preventing the trap mechanism 15 from being clogged.

<Film Forming Apparatus>

Next, a film forming apparatus employing the above-described gas supply mechanism will be described. A film forming apparatus for forming a tungsten film on a wafer W, which is a workpiece, using $WCl_6$ of a solid raw material as the raw material S and using a $H_2$ gas as a reducing gas will be illustrated.

Figure 3:
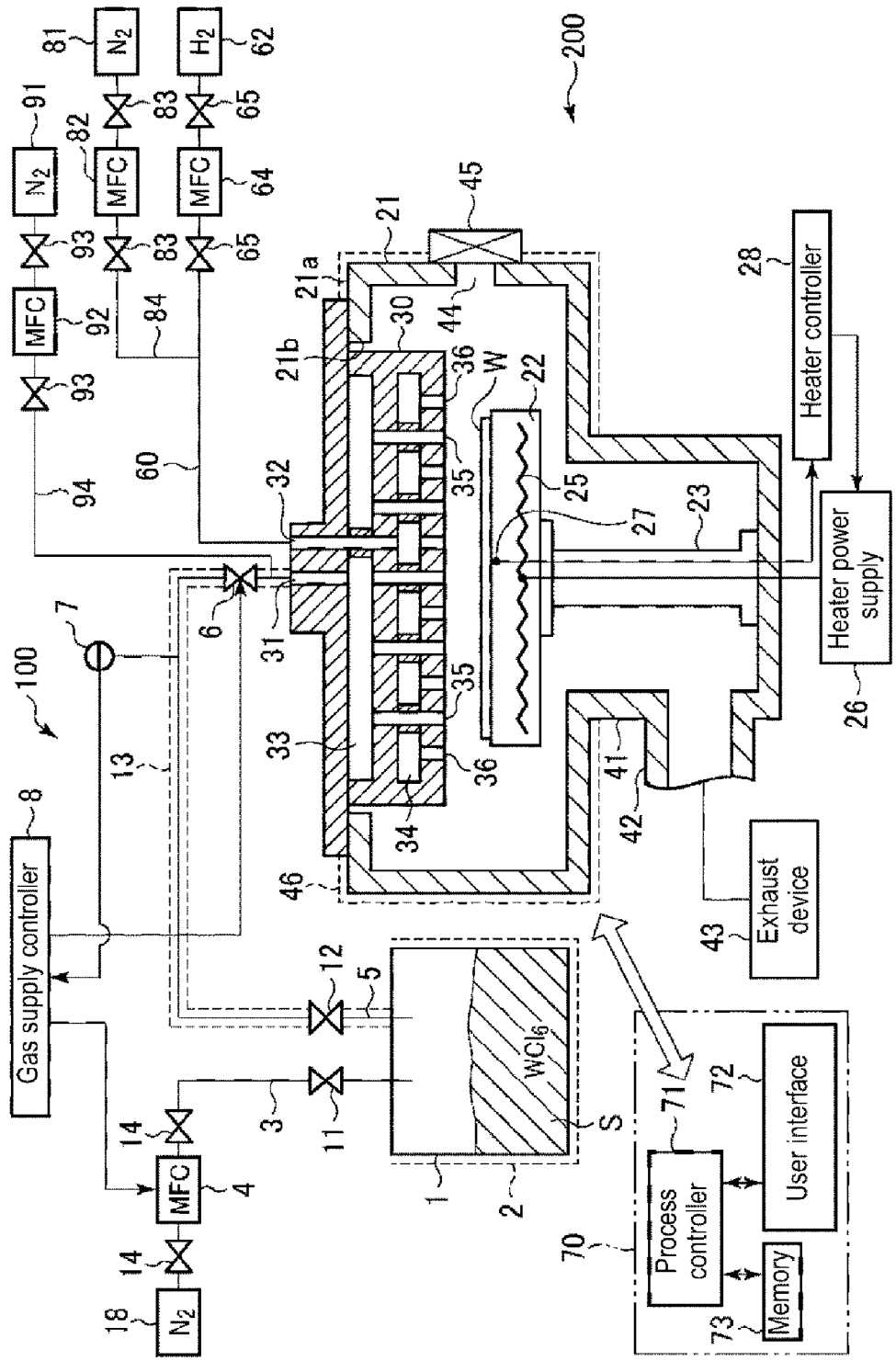
FIG. 3 is a sectional view showing a film forming apparatus having the gas supply mechanism according to one embodiment of the present disclosure.

FIG. 3 is a sectional view showing a film forming apparatus having the gas supply mechanism according to one embodiment of the present disclosure. As shown in FIG. 3, the film forming apparatus 200 has a substantially cylindrical chamber 21, which is airtight, and a susceptor 22 for horizontally supporting a wafer W as a workpiece is disposed in the chamber 21 and is supported by a cylindrical support member 23 extending from a bottom of an exhaust chamber to be described later to a central lower portion of the susceptor 22. The susceptor 22 is made of, for example, ceramics such as MN or the like. In addition, a heater 25 is embedded in the susceptor 22 and is connected with a heater power supply 26. A thermocouple 27 is installed near the top surface of the susceptor 22 and it is configured to transmit a signal of the thermocouple 27 to a heater controller 28. In response to the signal of the thermocouple 27, the heater controller 28 transmits a command to the heater power supply 26 to control heating of the heater 25, thereby controlling the wafer W at a predetermined temperature. Three wafer elevating pins (not shown) are installed in the susceptor 22 to be protrudable with respect to the surface of the susceptor 22, thereby becoming a protruding state from the surface of the susceptor 22. The susceptor 22 is adapted to be elevated by an elevating mechanism (not shown).

A circular hole 21b is formed in a ceiling wall 21a of the chamber 21 and a shower head 30 is fitted so as to protrude from the circular hole 21b into the chamber 21. The shower head 30 is provided to discharge the $WCl_6$ gas, which is the raw material gas, the $H_2$ gas, which is the reducing gas, and a purge gas into the chamber 21. The shower head 30 includes a first introduction path 31 for introducing the $WCl_6$ gas and a $N_2$ gas as the purge gas, and a second introduction path 32 for introducing the $H_2$ gas and the $N_2$ gas as the purge gas at an upper part of the shower head 30.

Spaces 33 and 34 are formed in upper and lower stages inside the shower head 30. The first introduction path 31 is connected to the upper space 33, and a first gas discharge path 35 extends from the upper space 33 to the bottom of the shower head 30. The second introduction path 32 is connected to the lower space 34, and a second gas discharge path 36 extends from the lower space 34 to the bottom of the shower head 30. That is, the shower head 30 is adapted to independently discharge $WCl_6$ gas as the film forming raw material gas and the $H_2$ gas as the reducing gas from the gas discharge paths 35 and 36, respectively.

An exhaust chamber 41 is formed at the bottom wall of the chamber 21 to protrude downwardly. An exhaust pipe 42 is connected to the side of the exhaust chamber 41 and an exhaust device 43 including a vacuum pump, a pressure control valve and so on is connected to the exhaust pipe 42. It is possible to put the interior of the chamber 21 into a predetermined decompression condition by actuating the exhaust device 43.

A loading/unloading port 44 for loading/unloading the wafer W and a gate valve 45 for opening/closing the loading/unloading port 44 are formed in the side wall of the chamber 21. In a wall portion of the chamber 21 is installed a heater 46 which enables control of the temperature of the inner wall of the chamber 21 in the film forming process.

The film forming apparatus 200 includes the gas supply mechanism 100 as shown in FIG. 1 for supplying the $WCl_6$ gas into the shower head 30 of the chamber 21. The gas supply mechanism 100 accommodates $WCl_6$, which is solid at room temperature, as the raw material S, in the raw material container 1, sublimates the raw material S by means of the heater 2, bubbles the sublimated raw material S with the carrier gas supplied from the carrier gas supply pipe 3, and supplies the $WCl_6$ gas generated in the raw material container 1, along with the carrier gas, into the shower head 30 of the chamber 21 through the raw material gas supply pipe 5. The supply of gas at this time is controlled by the gas supply controller 8. Detailed configurations are the same as those in FIG. 1 and therefore, detailed explanation will be omitted. In this example, the $N_2$ gas is used as the carrier gas supplied through the carrier gas supply pipe 3 and a $N_2$ gas supply source 18 is connected to the carrier gas supply pipe 3. The interior of the raw material container 1 is adapted to be heated to an appropriate temperature within a range of, for example, 80 to 300 degrees C. by the heater 2.

A $N_2$ gas supply source 91 is connected to the raw material gas supply pipe 5 via a purge gas pipe 94. A mass flow controller 92 as a flow rate controller and opening/closing valves 93 disposed in front and rear of the mass flow controller 92, respectively, are installed on the purge gas pipe 94. A $N_2$ gas from the $N_2$ gas supply source 91 is used as a purge gas at a raw gas line.

A pipe 60 serving as a $H_2$ gas (reducing gas) line is connected to the second introduction path 32 of the shower head 30. A $H_2$ gas supply source 62 for supplying the $H_2$ gas as the reducing gas is connected to the pipe 60. In addition, the pipe 60 is connected to a $N_2$ gas supply source 81 via a purge gas pipe 84. In addition, a mass flow controller 64 as a flow rate controller and opening/closing valves 65 disposed in front and rear of the mass flow controller 64, respectively, are installed on the pipe 60. A mass flow controller 82 as a flow rate controller and opening/closing valves 83 disposed in front and rear of the mass flow controller 82, respectively, are installed on the purge gas pipe 84. A $N_2$ gas from the $N_2$ gas supply source 81 is used as a purge gas at a $H_2$ gas line.

In addition, the carrier gas and the purge gas are not limited to the $N_2$ gas but may be other inert gases such as an Ar gas and the like. The reducing gas is not limited to the $H_2$ gas but may be a $NH_3$ gas, a $SiH_4$ gas or a $B_2H_6$ gas. Two or more of the $H_2$ gas, the $NH_3$ gas, the $SiH_4$ gas and the $B_2H_6$ gas may be supplied. Reducing gases other than the above-mentioned reducing gases may be used.

The film forming apparatus 200 includes a control unit 70 configured to control various components such as power supply, the heater controller 28, the gas supply controller 8, the opening/closing valves 65, 83 and 93, a pump and so on. The control unit 70 includes a process controller 71 such as a microprocessor (computer), a user interface 72 and a memory 73. The various components of the film forming apparatus 200 are electrically connected to and controlled by the process controller 71. The user interface 72 is connected to the process controller 71 and includes a keyboard to allow a user to input commands for management of the film forming apparatus 200, a display for visualizing and displaying operation status of the various components of the film forming apparatus, etc. The memory 73 is also connected to the process controller 71. The memory 73 stores control programs for implementing various processes performed by the film forming apparatus 200 with the control of the process controller 71, control programs (i.e., process recipes) for causing the various components of the film forming apparatus 200 to perform respective processes according to process conditions, various databases, etc. The process recipes are stored in a storage medium (not shown) in the memory 73. The storage medium may be a hard disk or the like which is fixed, or a transportable storage medium such as a CD-ROM, DVD, flash memory or the like. In addition, the recipes may be appropriately received from other apparatuses through dedicated lines.

Specific recipes are read from the memory 73 according to instructions from the user interface 72 as necessary and executed in the processor controller 71, so that a desired process is performed in the film forming apparatus 200 under control of the process controller 71.

Next, a film forming operation performed by using the film forming apparatus 200 as configured above will be described.

First, the gate valve 45 is opened to load the wafer W into the chamber 21 via the loading/unloading port 44 by means of a transfer device (not shown), the wafer W is mounted on the susceptor 22 heated to a predetermined temperature by the heater 25, the interior of the chamber 21 is decompressed to a predetermined degree of vacuum, and then, a tungsten film forming process is performed according to an ALD method, as described below. A wafer in which a barrier metal film (for example, a TiN film) is formed, as a base film, on a surface of a thermally-oxidized film or a surface of an interlayer insulating film having recess portions such as trenches or holes may be used as an example of the wafer W.

Figure 4:
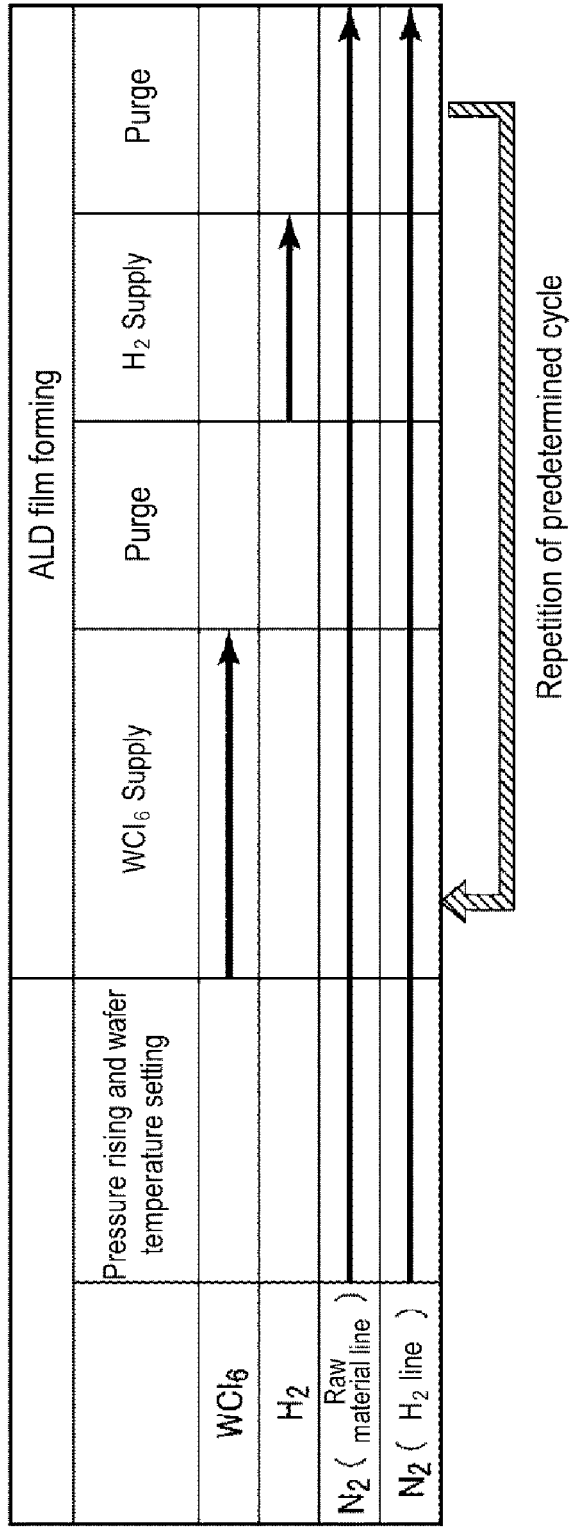
FIG. 4 is a view showing a film forming recipe in the film forming apparatus of FIG. 3.

Based on process recipes shown in FIG. 4, the tungsten film forming film is performed according to the ALD method.

First, while keeping the opening/closing valves 11 and 12 and the raw material gas supply/shut-off valve 6 of the gas supply mechanism 100 and the opening/closing valve 65 of the pipe 60 serving as the $H_2$ gas (reducing gas) line in a closed state, the opening/closing valves 83 and 93 are opened to supply $N_2$ gases as purge gases (a purge gas at the raw material gas line and a purge gas at the $H_2$ gas line) from the $N_2$ gas supply sources 81 and 91, thereby increasing the internal pressure of the chamber 21 and the temperature of the wafer W on the susceptor 32 is stabilized.

Meanwhile, in the gas supply mechanism 100, while the opening/closing valves 11 and 12 and the raw material gas supply/shut-off valve 6 are in a closed state as described above, the raw material S in the raw material container 1 is sublimated by heating the raw material S to a certain temperature (for example, 80 to 300 degrees C.) by means of the heater 2. Next, the opening/closing valves 11, 12 and 14 are opened and a $N_2$ gas as a carrier gas flows into the raw material container 1 via the carrier gas supply pipe 3 at a certain flow rate under control of the mass flow controller 4, which causes bubbling to sublimate $WCl_6$ in a solid state in the raw material container 1, thereby generating a $WCl_6$ gas as a raw material gas. Then, the $WCl_6$ gas is supplied, along with the carrier gas, into the raw material gas supply pipe 5, so that the insides of the raw material container 1 and the raw material gas supply pipe 5 become a high-pressure condition. In this condition, an operation of opening the raw material gas supply/shut-off valve 6 to supply the $WCl_6$ gas as the raw material gas into the chamber 21 is performed to adsorb the $WCl_6$ gas on a base film formed on the surface of the wafer W ($WCl_6$ gas supply step). More specifically, for example, the gas supply controller 8 may perform control of adjusting the flow rate of the carrier gas at a predetermined flow rate and opening the raw material gas supply/shut-off valve 6 to supply the raw material gas into the chamber 21 after lapse of a predetermined time corresponding to the predetermined flow rate. Even in this case, as described above, the gas supply controller 8 may monitor the pressure of the raw material gas supply pipe 5 through the pressure gauge 7 and close the opening/closing valve 11 to stop the supply of the carrier gas when a detected value of the pressure gauge 7 exceeds a preset value. In addition, the gas supply controller 8 may set the pressure of the raw material gas supply pipe 5 to a predetermined value, obtain a difference between the detected value of the pressure gauge 7 and the predetermined value, and issue a control command to the mass flow controller 4 to control the flow rate of the carrier gas so as to eliminate the difference. In such a control, PID control may be preferable in view of performing high precision control.

Next, while the $N_2$ gas as the purge gas flows, the raw material gas supply/shut-off valve 6 is closed to stop the supply of the $WCl_6$ gas and the remaining $WCl_6$ gas in the chamber 21 is purged (purge step).

Next, while the $N_2$ gas as the purge gas flows, the opening/closing valve 65 is opened to supply a $H_2$ gas from the $H_2$ gas supply source 62 into the chamber 21 for a short time, which causes the $H_2$ gas to react with $WCl_6$ adsorbed on the wafer W ($H_2$ gas supply step).

Next, while the $N_2$ gas as the purge gas flows, the opening/closing valve 65 is closed to stop the supply of the $H_2$ gas and the remaining $H_2$ gas in the chamber 21 is purged (purge step).

A thin tungsten unit film is formed through one cycle of the $WCl_6$ gas supply step, purge step, $H_2$ gas supply step and purge step, which are described above. As these steps are repeated by a plurality of cycles, a tungsten film having a desired film thickness is formed. The film thickness of the tungsten film can be controlled by the number of repetitions of the cycle.

In this case, when the $WCl_6$ gas as the raw material gas is supplied, as described above, the interior of the raw material container 1 and the interior of the raw material gas supply pipe 5 can be maintained at a high pressure. In addition, when the raw material gas is supplied, although the internal pressures of the raw material container 1 and the raw material gas supply pipe 5 are lowered by opening the raw material gas supply/shut-off valve 6, the internal pressures increase again when the raw material gas supply/shut-off valve 6 is closed. Accordingly, even when the raw material gas is intermittently supplied for forming a film using an ALD method, the raw material gas can be introduced into the chamber 21 at a high pressure at a time when the raw material gas supply/shut-off valve 6 is opened, which makes it possible to supply the raw material at a high flow rate. Accordingly, even when $WCl_6$ existing in a solid state at the room temperature, which a carrier gas is needed for supply, is used as a raw material, a film can be formed using the ALD method having a short cycle, so that a tungsten film can be formed at a high throughput.

As conditions for use of $WCl_6$ as a tungsten raw material, the wafer temperature (susceptor surface temperature) may be adjusted to 400 degrees C. or more and the chamber internal pressure to 10 Torr (1333 Pa) or more, although the conditions may vary depending on the type of the base film. This is because it is hard to generate a film forming reaction if the wafer temperature is lower than 400 degrees C. and it is easy to generate an etching reaction at 400 degrees C. or more if the chamber internal pressure is lower than 10 Torr. From the viewpoint of restrictions on the apparatus and reactivity, an actual upper limit of the wafer temperature is about 800 degrees C., or 400 to 700 degrees C., or 400 to 650 degrees C. Similarly, from the viewpoint of restrictions on the apparatus and reactivity, an actual upper limit of the chamber internal pressure is 100 Torr (13333 Pa), or 10 to 30 Torr (1333 to 4000 Pa).

In addition, for such tungsten film formation, the flow rate of $N_2$ gas as the carrier gas falls within a range of 50 to 5000 sccm (mL/min) and the internal pressures of the raw material container 1 and the raw material gas supply pipe 5 fall within a range of 50 to 200 Torr (6.65 to 26.6 kPa), whereby the carrier gas including the $WCl_6$ gas as the raw material gas can flow into the chamber 21 at a flow rate higher than the conventional flow rate of 50 to 5000 sccm (mL/min) which is substantially equal to the flow rate of the supplied carrier gas. The above-described film formation using the ALD method may be performed under conditions that a $WCl_6$ gas supply time (per once) is 0.5 to 10 sec, a $H_2$ gas flow rate is 500 to 5000 sccm (mL/min), a $H_2$ gas supply time (per once) is 0.5 to 10 sec, and a heating temperature of raw material container is 130 to 170 degrees C.

In addition, as described above, a $SiH_4$ gas or a $B_2H_6$ gas may be used as the reducing gas, in addition to the $H_2$ gas, and different embodiments of film formation can be performed under the similar conditions even for a case using these gases. However, from the viewpoint of further reduction of impurities in the film, an $H_2$ gas may be used in some instances.

EXPERIMENTAL EXAMPLES

Next, experimental examples will be described.

Experimental Example 1

Here, for a wafer including a TiN film as a base film, a $WCl_6$ gas was used as a raw material gas, a $H_2$ gas was used as a reducing gas, and a tungsten film was formed under the following conditions.

Chamber internal pressure: 30 Torr (4000 Pa)
Wafer temperature: 500 degrees C.
Carrier gas ($N_2$ gas) flow rate: 500 sccm (mL/min)
$H_2$ gas flow rate: 4500 sccm (mL/min)
$WCl_6$ gas supply/purge/$H_2$ gas supply/purge times: 0.3/0.3/0.3/0.3 (sec)

Figure 5:
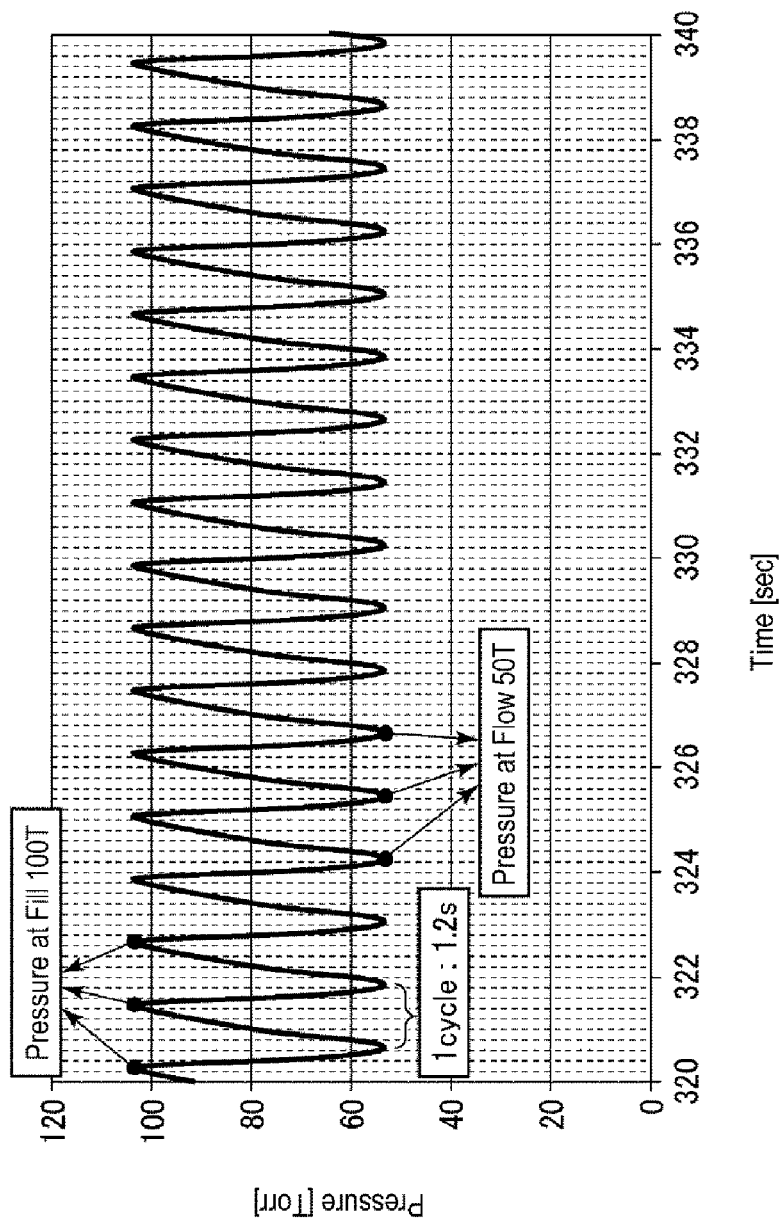
FIG. 5 is a view showing variation in a pressure of a raw material gas supply pipe in ALD film forming.

A pressure detected by the pressure gauge installed in the raw material gas pipe is shown in FIG. 5. As shown in FIG. 5, the pressure was 100 Torr when the raw material gas supply/shut-off valve 6 was closed (i.e., filling), and the pressure was 50 Torr when the raw material gas supply/shut-off valve 6 was opened (i.e., flowing). It was confirmed from this that the pressure during raw material supply even in ALD recipes at a high speed was maintained at a high value, thereby making it possible to supply the raw material gas at a high flow rate. It was also confirmed that the tungsten film could be formed with high step coverage in the ALD recipes at a high speed.

<Other Applications>

Although the embodiments of the present disclosure have been illustrated above, the present disclosure is not limited thereto but may be modified in different ways. For example, although it has been illustrated in the above embodiments that the present disclosure is applied to formation of the tungsten film using the $WCl_6$ gas, the example may not be limited thereto. It should be understood that the present disclosure may be applied to a case where a solid raw material or a liquid raw material is supplied using a carrier gas.

In addition, although a semiconductor wafer has been illustrated as a substrate to be processed, the semiconductor wafer may be silicon or compound semiconductor such as GaAs, SiC, GaN or the like. In addition, the wafer may not be limited to the semiconductor wafer, and the present disclosure may be applied to glass substrates for use in FPDs (Flat Panel Displays) such as liquid crystal displays, ceramics substrates, and the like.

According to the present disclosure in some embodiments, it is possible to put the interiors of the raw material container and the raw material gas supply pipe under a high-pressure state when the raw material gas supply/shut-off valve is closed, and to introduce the raw material gas with a high pressure into the chamber by opening the raw material gas supply/shut-off valve. In addition, although the internal pressures of the raw material container and the raw material gas supply pipe are lowered by opening the raw material gas supply/shut-off valve for supply of the raw material gas, the internal pressures are raised again in a short time when the raw material gas supply/shut-off valve is closed. Accordingly, even for short intermittent supply of the raw material gas, the raw material gas can be introduced into the chamber at a high pressure at a high flow rate from the point of time when the raw material gas supply/shut-off valve is opened. In addition, since the raw material gas needs not to be bypassed to an exhaust line, a raw material can be prevented from being wasted.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A gas supply mechanism of supplying a raw material gas obtained from a raw material of a solid state or a liquid state into a chamber configured to perform a film forming process on a workpiece, comprising:
    a raw material container configured to accommodate a raw material in a solid state or a liquid state;
    a heater configured to heat the raw material for sublimation or vaporization in the raw material container;
    a carrier gas supply pipe configured to supply a carrier gas into the raw material container;
    a flow rate controller configured to control a flow rate of the carrier gas in the carrier gas supply pipe;
    a raw material gas supply pipe directly connecting the raw material container with the chamber and configured to supply a raw material gas generated by the sublimation or vaporization of the raw material in the raw material container into the chamber along with the carrier gas;
    a raw material gas supply/shut-off valve installed on the raw material gas supply pipe in the vicinity of the chamber and configured to be opened/closed to supply/shut off the raw material gas into the chamber in a film forming process; and a gas supply controller configured to control a flow rate of the carrier gas by means of the flow rate controller, and to enable the carrier gas to flow into the raw material container while closing the raw material gas supply/shut-off valve sealing the raw material gas supply pipe to thereby increase internal pressures of the raw material container and the raw material gas supply pipe to be a high-pressure condition and then control the raw material gas supply/shut-off valve to be opened and then closed to intermittently supply the raw material gas into the chamber, wherein the gas supply controller is configured to control the carrier gas to a predetermined flow rate and control the raw material gas supply/shut-off valve to be opened to supply the raw material gas into the chamber, the raw material gas supply/shut-off valve being opened at a predetermined time corresponding to the predetermined flow rate after the carrier gas flows into the raw material container, and wherein the gas supply controller is configured to control the carrier gas to continuously flow into the raw material container during the film forming process regardless of whether the raw material gas supply/shut-off valve is opened or closed.

2. The gas supply mechanism of claim 1, further comprising a pressure gauge installed in the raw material container or the raw material gas supply pipe.

3. The gas supply mechanism of claim 2, wherein the gas supply controller is configured to monitor a detected value by the pressure gauge and control the supply of the carrier gas to be stopped when the detected value exceeds a set value.

4. The gas supply mechanism of claim 2, wherein the gas supply controller is configured to obtain a difference between a detected value by the pressure gauge and a preset value and control a flow rate of the carrier gas so as to eliminate the difference.

5. The gas supply mechanism of claim 1, wherein the raw material gas supply pipe is inserted in the raw material container, the gas supply mechanism further comprising:
a trap mechanism configured to cover an end portion of the raw material gas supply pipe in the raw material container; and
a heater configured to heat the trap mechanism.

6. A film forming apparatus for forming a predetermined film on a workpiece using an atomic layer deposition method of alternately supplying and reacting a first gas, which is a raw material gas generated from a raw material of a solid state or a liquid state, and a second gas, which is a reducing gas, for reaction, comprising:
a chamber configured to accommodate a workpiece;
a first gas supply mechanism configured to supply the first gas as a raw material gas into the chamber;
a second gas supply mechanism configured to supply the second gas as a reducing gas into the chamber;
an exhaust mechanism configured to exhaust the chamber; and
a control unit configured to control the first gas supply mechanism and the second gas supply mechanism to alternately supply the first gas and the second gas,
wherein the first gas supply mechanism includes:
a raw material container configured to accommodate a raw material of a solid state or a liquid state;
a heater configured to heat the raw material for sublimation or vaporization in the raw material container;
a carrier gas supply pipe configured to supply a carrier gas into the raw material container;
a flow rate controller configured to control a flow rate of the carrier gas in the carrier gas supply pipe;
a raw material gas supply pipe directly connecting the raw material container with the chamber and configured to supply the first gas as a raw material gas generated by the sublimation or vaporization of the raw material in the raw material container into the chamber along with the carrier gas;
a raw material gas supply/shut-off valve installed on the raw material gas supply pipe in the vicinity of the chamber and configured to be opened/closed to supply/shut off the first gas as the raw material gas into the chamber in a film forming process; and
a gas supply controller configured to control a flow rate of the carrier gas by means of the flow rate controller, and to enable the carrier gas to flow into the raw material container while closing the raw material gas supply/shut-off valve sealing the raw material gas supply pipe to thereby increase internal pressures of the raw material container and the raw material gas supply pipe to be a high-pressure condition, and then control the raw material gas supply/shut-off valve to be opened and then closed to intermittently supply the raw material gas into the chamber,
wherein the gas supply controller is configured to control the carrier gas to a predetermined flow rate and control the raw material gas supply/shut-off valve to be opened to supply the raw material gas into the chamber, the raw material gas supply/shut-off valve being opened at a predetermined time corresponding to the predetermined flow rate after the carrier gas flows into the raw material container, and
wherein the gas supply controller is configured to control the carrier gas to continuously flow into the raw material container during the film forming process regardless of whether the raw material gas supply/shut-off valve is opened or closed.

7. The film forming apparatus of claim 6, wherein the first gas supply mechanism further includes a pressure gauge installed in the raw material container or the raw material gas supply pipe.

8. The film forming apparatus of claim 7, wherein the gas supply controller is configured to monitor a detected value by the pressure gauge and control the supply of the carrier gas to be stopped when the detected value exceeds a set value.

9. The film forming apparatus of claim 7, wherein the gas supply controller is configured to obtain a difference between a detected value by the pressure gauge and a preset value and control a flow rate of the carrier gas so as to eliminate the difference.

* * * * *